United States Patent [19]
Adachi et al.

[11] Patent Number: 5,195,111
[45] Date of Patent: Mar. 16, 1993

[54] PROGRAMMABLE FREQUENCY DIVIDING APPARATUS

[75] Inventors: Nobuyuki Adachi; Kazuo Yamashita; Akiharu Inoue, all of Mitaka, Japan

[73] Assignee: Nihon Musen Kabushiki Kaisha, Tokyo, Japan

[21] Appl. No.: 744,448

[22] Filed: Aug. 13, 1991

[30] Foreign Application Priority Data

Sep. 7, 1990 [JP] Japan .................................. 2-237386
Sep. 7, 1990 [JP] Japan .................................. 2-237387

[51] Int. Cl.$^5$ ............................................. H03K 21/38
[52] U.S. Cl. ......................................... 377/52; 377/47; 377/48
[58] Field of Search ............................. 377/52, 47, 48

[56] References Cited

U.S. PATENT DOCUMENTS

| | | | |
|---|---|---|---|
| Re. 32,605 | 2/1988 | Yamashita et al. | 377/47 |
| 3,202,837 | 8/1965 | Baracket | 328/48 |
| 4,053,739 | 10/1977 | Miller et al. | 364/703 |
| 4,495,630 | 1/1985 | Thompson et al. | 377/110 |
| 4,575,867 | 3/1986 | Hogue | 377/110 |
| 4,606,059 | 8/1986 | Oida | 377/47 |
| 4,651,334 | 3/1987 | Hayashi | 377/47 |
| 4,715,052 | 12/1987 | Stambaugh | 377/108 |
| 5,065,415 | 11/1991 | Yamashita | 377/52 |
| 5,077,764 | 12/1991 | Yamashita | 377/48 |

FOREIGN PATENT DOCUMENTS

3142167A1 10/1981 Fed. Rep. of Germany .
61-280121 12/1986 Japan .
3-136520 6/1991 Japan .
2237434A 1/1991 United Kingdom .

OTHER PUBLICATIONS

H. Futami et al., "A Single Chip 1.2 GHz PLL Frequency Synthesizer LSI", 1987, IEEE Int. Conf. on Consumer Electronics, New York, U.S., FIG. 2, pp. 194-195.

PLL, Thomas Schreiner, How to Product Any Frequency with Digital Synthesizers, ELO 1979, Franzis-Verlag GmbH, Munich, Germany.

Primary Examiner—William L. Sikes
Assistant Examiner—Scott A. Ouellette
Attorney, Agent, or Firm—Frishauf, Holtz, Goodman & Woodward

[57] ABSTRACT

A programmable frequency dividing network comprises a plurality of cascade-connected programmable frequency dividing stages each of which divides the frequency of a clock pulse by two and three based on a logic level of a preset input signal used to change a variable division ratio from one to another. In addition, there is provided a gating means for determining or detecting whether or not each of the outputs of programmable frequency dividing stages of the programmable frequency dividing network after a programmable frequency dividing stage as a second stage is brought to a predetermined pattern and an instruction signal for making a decision as to the division of the division ratio by (+1) is inputted, so as to generate the output of a logic level for causing a programmable frequency dividing stage equivalent to a first stage to divide the frequency of the clock pulse by three if it is determined to be positive in the above detection process. Then, the output of the gating means is supplied to the programmable frequency dividing stage corresponding to the first stage in the programmable frequency dividing network so as to select either one of division ratios of n and (n+1) with respect to a programmable frequency dividing apparatus comprising the above network and the gating means.

15 Claims, 10 Drawing Sheets

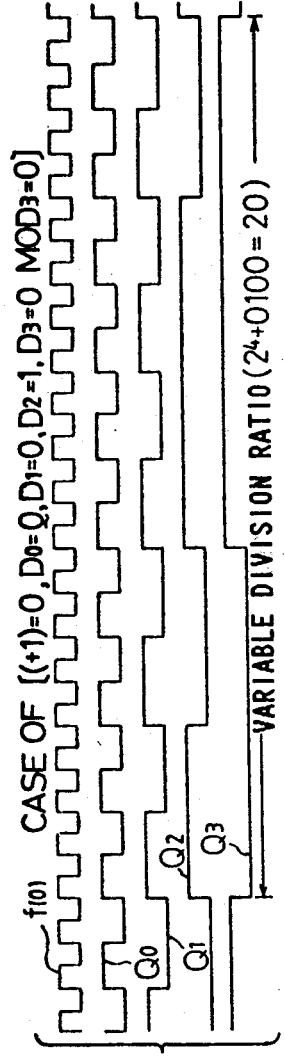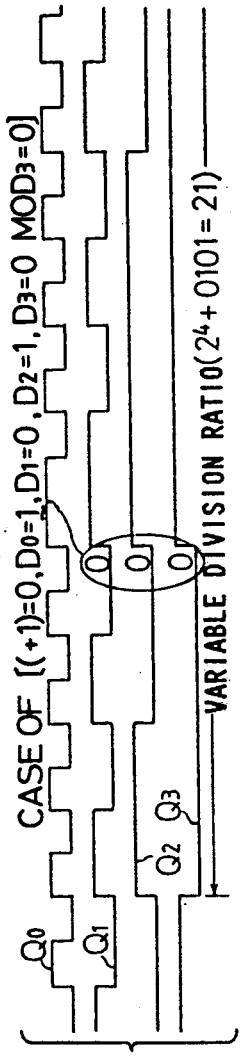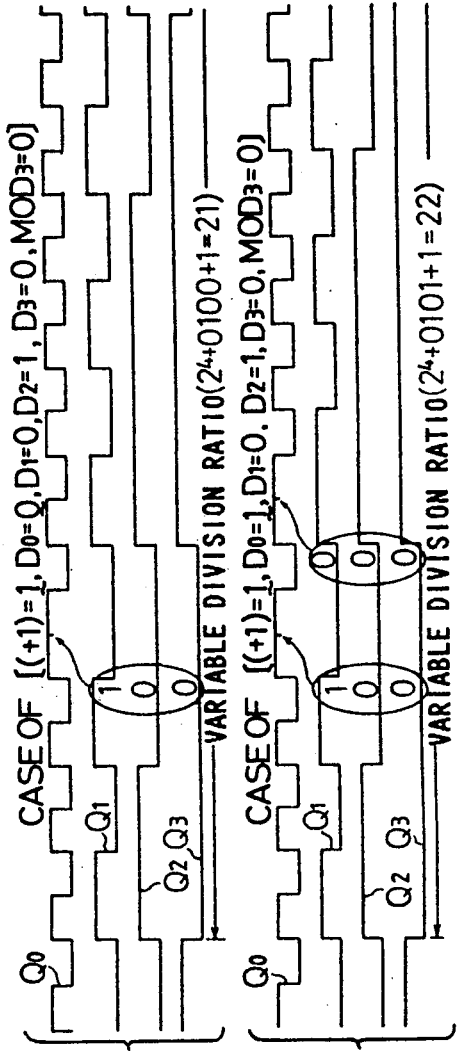
FIG.5a FIG.5b FIG.5c FIG.5d

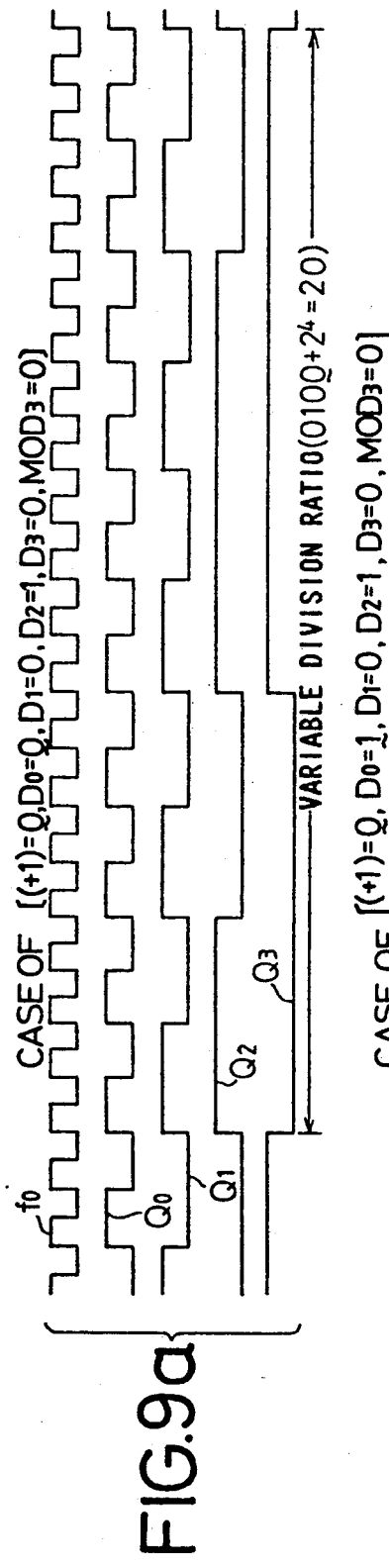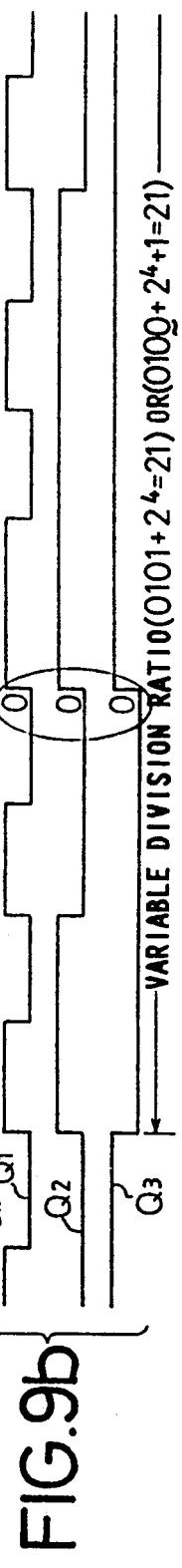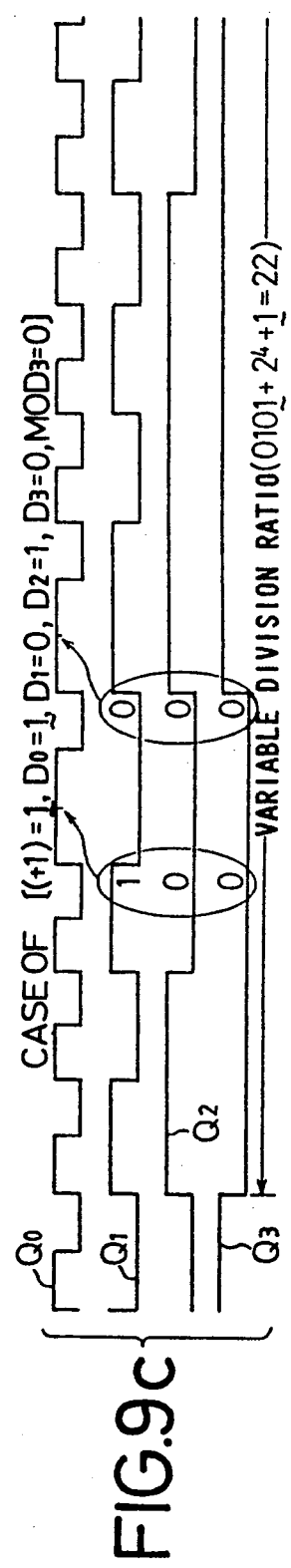

PROGRAMMABLE FREQUENCY DIVIDING APPARATUS

BACKGROUND OF THE INVENTION

1. Field of the Invention

The present invention relates to a programmable frequency dividing apparatus, and more specifically to a programmable frequency dividing apparatus which is suitable for use in a slip phase control phase-locked loop or the like and comprises a plurality of stages of cascade-connected programmable frequency dividers each of which is capable of selecting either one of variable division ratios of two and three so as to divide the frequency of an input signal by the division ratio thus selected.

There has not heretofore been proposed a programmable frequency dividing apparatus comprising a 2-scale-factor prescaler arranged in the form of plural stages in tandem, of such a type that the division of the frequency of an input signal by two and three is carried out. However, one example of the programmable frequency dividing apparatus has been proposed by the present applicant. As shown in FIG. 1, the proposed programmable frequency dividing apparatus has an inverter circuit 1, OR gates 2, 6, 8, a NOR gate 4, D flip-flop (D-FF) circuits 5, 7, and a buffer amplifier 3. As illustrated in FIG. 2, a programmable frequency divider 9 capable of selecting either one of variable division ratios of two and three in response to a preset input Di (Di is equal to either a logic "1" level or a logic "0" level) at each terminal D of the programmable frequency divider 9 is cascade-connected in the form of plural stages, thereby obtaining a desired division ratio. FIG. 2 shows one example in which programmable frequency dividers 9-0, 9-1, 9-2, . . . are cascade-connected to one another.

In the above programmable frequency divider 9, when an input signal at a terminal MOD is of a logic "1" level, a signal of the logic "1" level is delivered (outputted) to a terminal OC. Then, a clock signal inputted to a terminal CP is frequency-divided by two on the positive edge of the clock signal and the result of its frequency division is delivered to a terminal Q.

On the other hand, when the input signal at the MOD terminal is of a logic "0" level, a signal of the same level as that at the Q terminal is supplied to the OC terminal. When an input signal at a D terminal is of a logic "1" level, the input clock signal at the CP terminal is frequency-divided by three on the positive edge thereof and the result of its frequency division is sent to the Q terminal. Further, when the input signal at the D terminal is of a logic "0" level, the input clock signal at the CP terminal is frequency-divided by two on the positive edge thereof and the result of its frequency division is delivered to the Q terminal.

With the above arrangement of the type wherein the programmable frequency divider 9 has been arranged in tandem in the form of plural stages, an nth programmable frequency divider divides the frequency of the clock pulse signal by $2+D$ ($D=0$ or 1, which is determined depending on the level of a code supplied to the terminal D) only once in response to the level of the input signal at the D terminal when the outputs at the respective terminals Q of the programmable frequency dividers subsequent to the nth programmable frequency divider are all zero, followed by the division of the frequency of the clock pulse signal by two.

A description will now be made of the programmable frequency dividers 9 cascade-connected in the form of three stages, for example, in which a terminal $MOD_2$ of a programmable frequency divider (9-2) corresponding to a third stage is connected to the earth and set to a logic "0" level.

An input signal at the terminal $MOD_2$ is of a logic "0" level at all times. When a terminal $D_2$ (a signal applied to the terminal $D_2$) is of a logic "0" level, a $CP_2$ signal is frequency-divided by two. Further, when the $D_2$ terminal is maintained at a logic "1" level, the $CP_2$ signal is frequency-divided by three. In other words, the programmable frequency divider as the third stage divides the frequency of the input signal by $2+D_2$ ($D_2=0$ or 1, which is determined depending on the level of a code supplied to the terminal $D_2$).

In order to deliver $2+D_2$ clock signals as frequency-divided outputs to a terminal $Q_1$, a programmable frequency divider 9 1 as a second stage firstly divides the frequency of the input signal by $2+D_1$ ($D_1=0$ or 1, which is determined depending on the level of a code supplied to a terminal $D_1$) one time. This divider then divides the frequency of the signal by the remaining $1+D_2$, i.e., by two. That is to say, the programmable frequency divider 9-1 as the second stage and the programmable frequency divider 9-2 as the third stage respectively divide the frequencies of the $CP_1$ and $CP_2$ signals by division ratio setting codes (numbers) determined by the following equation (1):

$$1 \times (2 + D_1) + (1 + D_2) \times 2 = (2 + D_2) \times 2 D_1 = \qquad (1)$$

$$2^2 + D_2 \times 2^1 + D_1 \times 2^0$$

Similarly, in order to deliver $(2+D_2)\times 2+D_1$ clock signals to the output of a programmable frequency divider 9-0 as a first stage, pulses of a $CP_0$ signal according to a division ratio setting code (number) represented by the following equation (2) are counted:

$$[(2+D_2)\times 2+D_1]\times 2+D_0=2^3+D_2\times 2^2+D_1\times 2^1+D_0\times 2^0 \qquad (2)$$

Thus, the total output as a frequency-divided output can be determined from the programmable frequency divider 9-2 by dividing the frequency of the $CP_0$ signal by a division ratio determined from the following equation (3):

$$2^3+D_2\times 2^2+D_1\times 2^1+D_0\times 2^0 \qquad (3)$$

In the same manner as described above, the programmable frequency dividing apparatus comprising the programmable frequency divider 9 arranged in the form of n stages in tandem divides the input frequency by the division ratios determined by the following equation (4):

$$2^n+D_{n-1}\times 2^{n-1}+\ldots+D_2\times 2^2+D_1\times 2^1+D_0\times 2^0 \qquad (4)$$

The input signal is frequency divided by a continuously variable division ratio represented by the following equation (5):

$$2_2 - 2^{n+1}-1 \qquad (5)$$

However, when an instruction signal (hereinafter called "(+1) instruction signal ") for incrementing the division ratio by "+1" is inputted, the input signal cannot be frequency-divided by the division ratio greater than a preset division ratio by "+1".

Therefore, there has been proposed the following arrangement in order to cause a programmable frequency divider to divide an input frequency by a division ratio greater than a preset division ratio by "+1" in the PLL, for example. Specifically, let's now assume that a preset value of the programmable frequency divider is of an N bit. Under this condition, an N-bit adder is provided so that it is supplied with a "+1" instruction signal, thereby enabling the programmable frequency divider to divide the input frequency by the division ratio greater than the preset division ratio by "+1".

With the above arrangement, however, the N-bit adder is required. Therefore, the above arrangement develops problems such as increased circuit scales and an increased number of signal processing cycles, thereby making a circuit arrangement complex.

SUMMARY OF THE INVENTION

It is a first object of the present invention to provide a programmable frequency dividing apparatus for dividing an input frequency by a division ratio greater than a preset division ratio by "+1" when a (+1) instruction signal for increasing the division ratio by "+1" is inputted.

It is a second object of the present invention to provide a programmable frequency dividing apparatus capable of directly dividing the frequency of a high-frequency signal the optimum working frequency of which extends to several hundreds of MHz with a simple arrangement without increasing circuit scales and the number of signal processing cycles.

It is a third object of the present invention to provide a programmable frequency dividing apparatus of a type wherein a logic gate circuit is added to a programmable frequency divider comprising a plurality of cascade-connected programmable frequency dividing stages each of which selectively divides the frequency of an input clock signal by two and three, and a (+1) instruction signal for incrementing the division ratio by "+1" is inputted to the logic gate circuit so as to divide the input frequency by a division ratio greater than a preset division ratio by "+1".

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

FIGS. 5A-5D are waveform charts for describing the timing of each of Q outputs at respective programmable frequency dividing stages of the programmable frequency dividing apparatus according to the first embodiment of the present invention;

FIGS. 9A-9C are waveform charts for describing the timing of each of Q outputs at respective variable frequency dividing stages of the programmable frequency dividing apparatus according to the third embodiment of the present invention.

DETAILED DESCRIPTION OF THE PREFERRED EMBODIMENTS

A programmable frequency dividing apparatus according to the present invention will hereinafter be described in detail with reference to the accompanying drawings in which preferred embodiments are shown by way of illustrative example.

A description will first be made of a first embodiment of the present invention.

Figure 3:
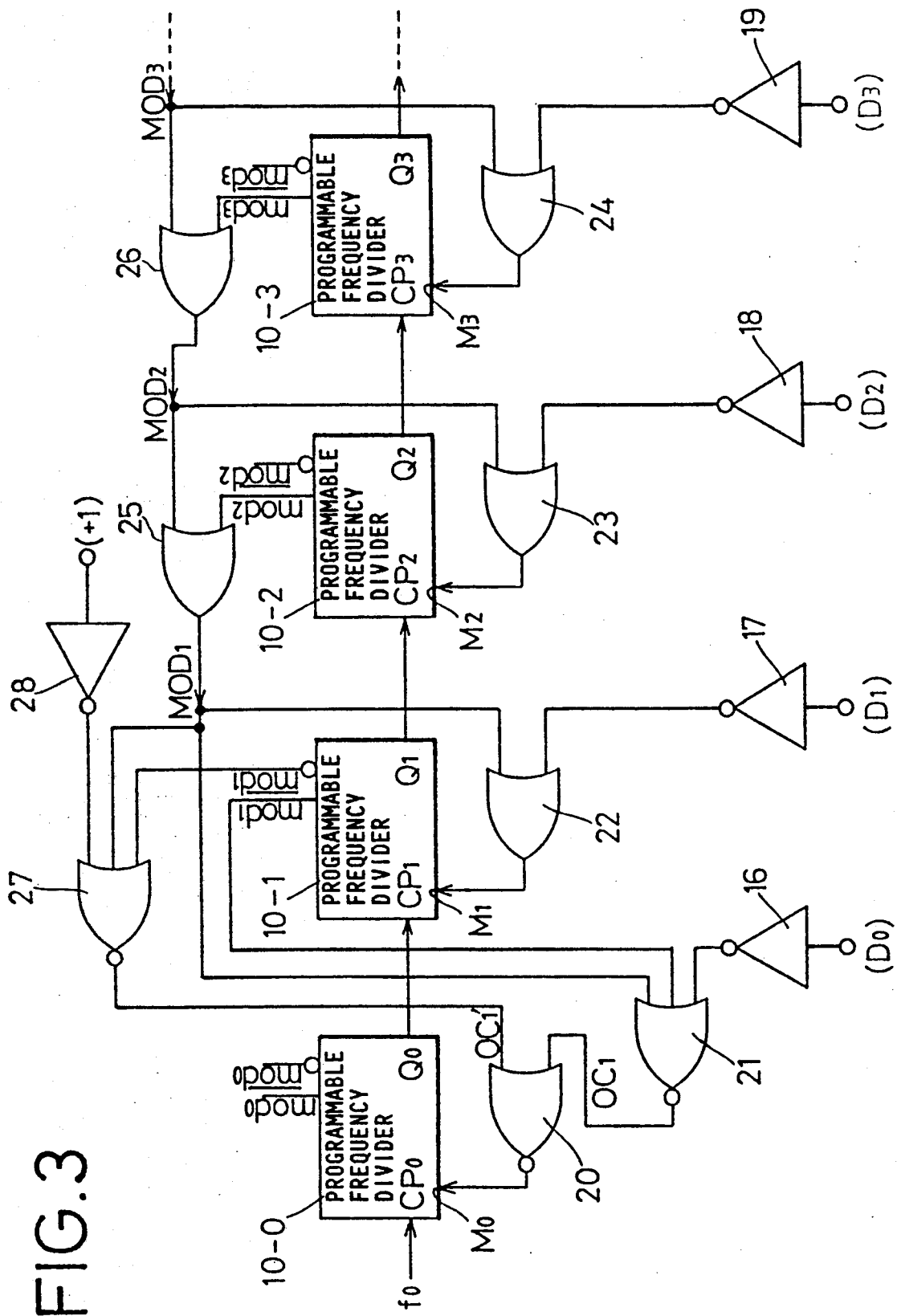
FIG. 3 is a block diagram showing a structure of a programmable frequency dividing apparatus according to a first embodiment of the present invention.

FIG. 3 is a block diagram showing a structure of the first embodiment. A programmable frequency dividing apparatus according to the first embodiment comprises a plurality of stages of cascade-connected programmable frequency dividers 10 each of which constitutes a 2-scale-factor prescaler shown in FIG. 4. More specifically, the programmable frequency dividing apparatus according to the first embodiment comprises cascade-connected programmable frequency dividers (which correspond to cascade-connected programmable frequency dividing stages and may collectively be considered to be a single programmable frequency network) 10-0, 10-1, 10-2, 10-3, . . . , each of which selectively divides the frequency of a clock signal by two and three.

Figure 4:
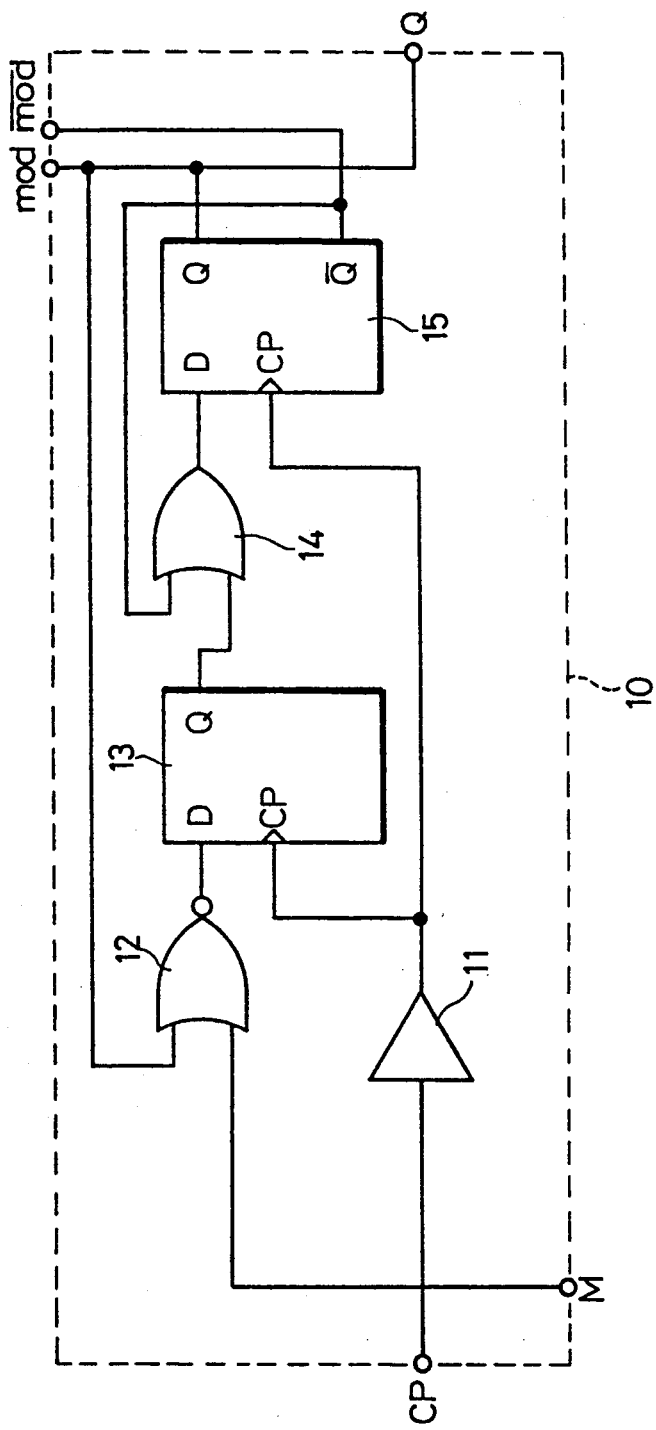
FIG. 4 is a block diagram showing a structure of a 2-scale-factor prescaler which forms each of programmable frequency dividing stages employed in the first embodiment of the present invention.

As it would be in the case where the programmable frequency divider 10 shown in FIG. 4 were employed, each of the programmable frequency dividers 10-0, 10-1, 10-2, 10-3, . . . has a NOR gate 12 supplied with a preset input M applied to a terminal M (i.e., each terminal will hereinafter be denoted by the same symbol or designation as that indicative of each signal) and with the Q output of a D flip-flop 15 corresponding to a second stage to be described later, a D flip-flop 13 supplied with the output of the NOR gate 12 to a terminal D thereof, an OR gate 14 supplied with the Q output of the D flip-flop 13 and the $\overline{Q}$ output of a D flip-flop 15, and the D flip-flop 15 supplied with the output of the OR gate 14 to a terminal D thereof. In addition, each of theses programmable frequency dividers inputs a clock pulse CP amplified by a buffer amplifier 11 to each of the D flip-flops 13 and 15 as a clock signal, thereby reading the respective inputs at the terminals D of the D flip-flops 13 and 15 on the rising edge of the clock signal and then storing them therein.

When the preset input M is of a logic "0" level, each of the programmable frequency dividers 10-1, 10-2, 10-3, . . . divides the frequency of the clock signal by three on the rising edge of the clock signal. On the other hand, when the preset input M is of a logic "1" level, each of these programmable frequency dividers divides the frequency of the clock signal by two. Thus, either one of variable division ratios of "two" and "three" is selected according to the level of the preset input M to be established. Incidentally, the $\overline{Q}$ output of the D flip-flop 15 and the Q output thereof are also represented by "$\overline{\text{mod}}$" and "mod" respectively, as shown in FIGS. 3 and 4.

In the first embodiment, an output $MOD_2$ from an OR gate 26 for detecting that each of the total Q outputs of unillustrated programmable frequency dividers subsequent to the programmable frequency divider as a fourth stage is of a logic "0" level, and an output $\overline{\text{mod}}_2$ from the programmable frequency divider 10-2 are both inputted to an OR gate 25, where the ORing is made. In addition, the output $MOD_2$ and a signal obtained by inverting a preset input $D_2$ with an inverter 18 are inputted to an OR gate 23 so as to calculate the logical sum. The output of the OR gate 23 is delivered to the programmable frequency divider 10-2 as a preset input $M_2$ thereof.

The operation of each of the cascade-connected programmable frequency dividers 10-3, . . . subsequent to the programmable frequency divider 10-2 is carried out in the same manner as described above. In the present embodiment, there are shown an inverter 19, an OR gate 24 and the OR gate 26 in FIG. 3.

Then, an output $MOD_1$ of the OR gate 25 and a signal obtained by inverting a preset input $D_1$ with an inverter 17 are inputted to an OR gate 22. In addition, the output of the OR gate 22 is supplied to the programmable frequency divider 10-1 as a preset input $M_1$ thereof.

The output $MOD_1$ of the OR gate 25, an output $\overline{\text{mod}}_1$ of the programmable frequency divider 10-1, and a signal obtained by inverting a (+1) instruction signal with an inverter 28 are applied to a NOR gate 27. Then, the output $MOD_1$ of the OR gate 25, an output $\text{mod}_1$ of the programmable frequency divider 10-1, and a signal obtained by inverting a preset input $D_0$ with an inverter 16 are inputted to a NOR gate 21. Further, an output $OC_1$ of the NOR gate 21 and an output $OC_{1'}$ of the NOR gate 27 are inputted to a NOR gate 20. Furthermore, the output of the NOR gate 20 is supplied to the programmable frequency divider 10-0 as a preset input $M_0$ thereof. Incidentally, a clock pulse to be supplied to the programmable frequency divider 10-0 is represented by $f_0$.

The OR gates 25, 26 and the NOR gate 27 exclusive of the output from the inverter 28 constitute a gate circuit for determining or detecting whether or not the Q output of each of programmable frequency dividers . . . 10-3, 10-2 and 10-1 is of a predetermined pattern. In the first embodiment, the gate circuit constructed as described is used to detect that the Q output of each of the programmable frequency dividers 10-3, 10-2 and 10-1 is of a 1(H) [hereinafter be abbreviated (H) indicative of hexadecimal].

The OR gates 25, 26, the NOR gate 27 inclusive of the output from the inverter 28, and the NOR gate 20 constitute a gate circuit for detecting that the (+1) instruction signal is inputted and the Q output of each of the programmable frequency dividers ..., 10-3, 10-2, 10-1 is a 1(H) so as to make a decision for causing the programmable frequency divider 10-3 to divide the frequency of the clock signal by three.

The OR gates 25, 26 and the NOR gate 21 exclusive of the output from the inverter 16 are used to detect that the Q output of each of the programmable frequency dividers . . . , 10-3, 10-2, 10-1 is of a predetermined value, i.e., a 0(H) in the present embodiment. When the preset input $D_0$ is inputted, the OR gates 25, 26, the inverter 16, the NOR gate 21 inclusive of the output from the inverter 16, and the NOR gate 20 constitute a gate circuit for detecting that the Q output of each of the programmable frequency dividers . . . , 10-3, 10-2, 10-1 is of a 0(H) so as to make a decision for causing the programmable frequency divider 10-0 to divide the frequency of the clock signal by three.

These gate circuits will be apparent from the following description of the operation of the first embodiment, which will be described later.

Figure 1:
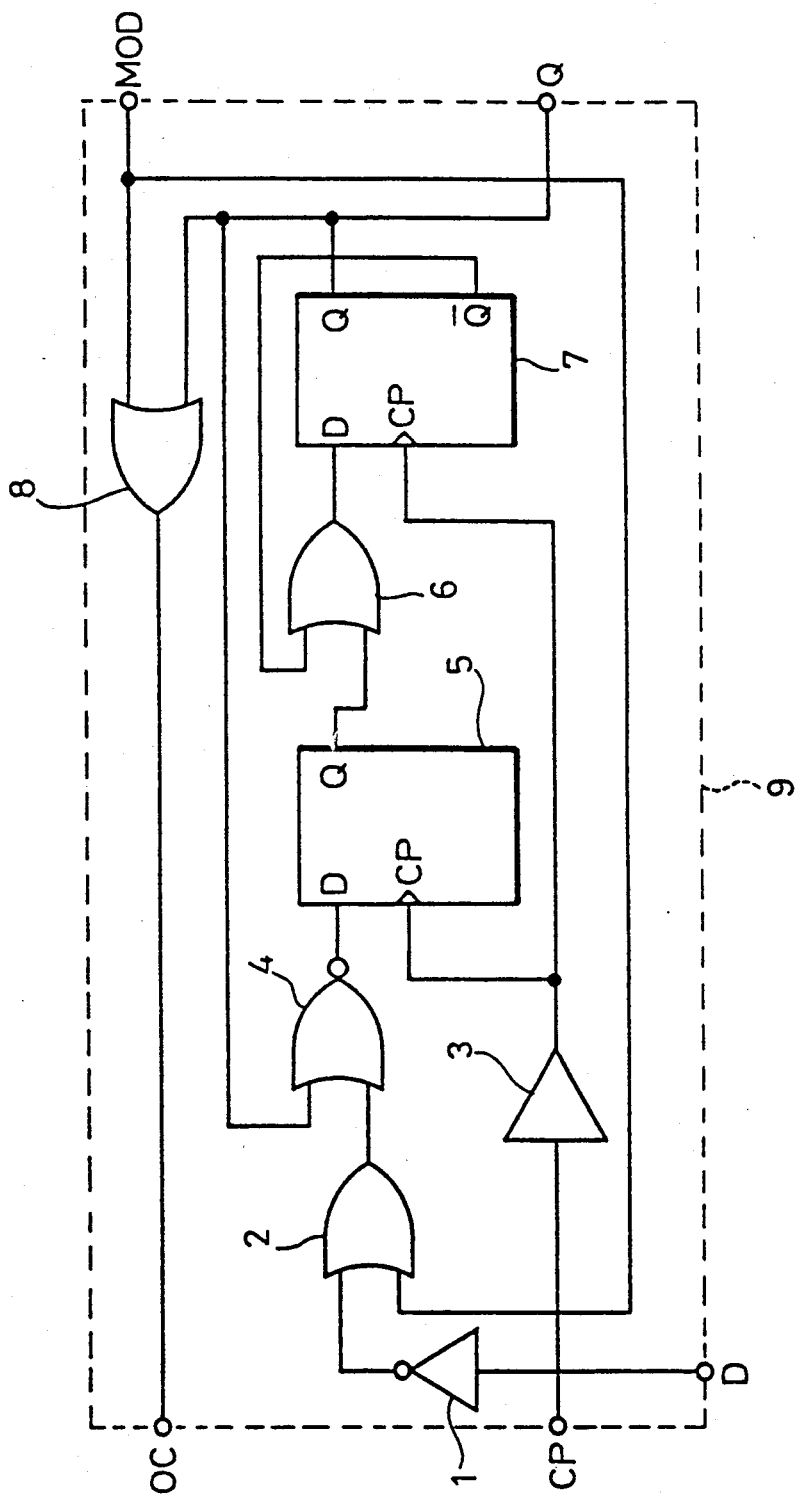
FIG. 1 is a block diagram showing a structure of a 2-scale-factor prescaler which constitutes a programmable frequency dividing stage for dividing an input frequency by two and three.

In the first embodiment constructed as described above, an OR gate 8 shown in FIG. 1 corresponds to each of the OR gates 25, 26, and an OR gate 2 is associated with each of the OR gates 22, 23, 24. In addition, an inverter 1 corresponds to each of the inverters 16, 17, 18, 19. In the illustrated embodiment, a programmable frequency divider shown in FIG. 1 is arranged in the form of plural stages in tandem, and the NOR gates 20, 21, 27 and the inverter 28 are additionally incorporated therein. Under this condition, the division of the frequency of the clock signal by three at the time the preset input $D_0$ is inputted is carried out during an interval in which the preset input $D_0$ goes to a logic "1" level, and each of the mod outputs, i.e., $\text{mod}_1$, $\text{mod}_2$, $\text{mod}_3$, . . . of the respective programmable frequency dividers 10-1, 10-2, 10-3, . . . is of a logic "0" level. On the other hand, the division of the frequency of the clock signal by three at the time the (+) 1 instruction signal of the inverter 28 is of a logic "1" level is carried out irrespective of the level of the incoming preset input $D_0$ during an interval in which the (+1) instruction signal is of a logic "1" level and the mod outputs, i.e., $\text{mod}_1$, $\text{mod}_2$, $\text{mod}_3$, . . . of the programmable frequency dividers 10-1, 10-2, 10-3, . . . are of a logic "1" level, a logic "0" level, a logic "0" level, . . . , respectively.

In the first embodiment constructed as described above, the programmable frequency dividers 10-0, 10-1, 10-2, 10-3, . . . sequentially frequency-divide the clock pulse $f_0$. In this case, each of the programmable frequency dividers 10-1, 10-2, 10-3, . . . performs the frequency-division operation in the same manner as described in the above expression (4).

A description will now be made of the frequency-division operation of the programmable frequency divider 10-0.

When the ($D_0$) signal and the (+1) instruction signal are both of a logic "0" level, each of the $OC_1$ and $OC_{1'}$ signals is of a logic "0" level and the NOR gate 20 outputs a logic "1" level. Therefore, the programmable frequency divider 10-0 divides the frequency of the input clock pulse $f_0$ by two on the positive (rising) edge of the clock pulse, and then routes or delivers the result of its frequency division to a terminal $Q_0$ thereof. When the ($D_0$) signal is of a logic "1" level and the (+1) instruction signal is of the logic "0" level, the $OC_{1'}$ signal is maintained at the logic "0" level, and the $OC_1$ signal is set to a logic "1" level during an interval in which each of the outputs at all the terminals Q of the programmable frequency dividers after the programmable frequency dividers 10-1 is of a logic "0" level. As a consequence, the NOR gate 20 outputs a logic "0" level, and hence the programmable frequency divider 10-0 divides the frequency of the clock pulse $f_0$ by three only one time on the positive edge thereof and delivers the result of its frequency division to the terminal $Q_0$ thereof.

When the ($D_0$) signal is of a logic "0" level and the (+1) instruction signal is of a logic "1" level, the $OC_1$ signal is maintained at a logic "0" level, and the $OC_{1'}$ signal is maintained at a logic "1" level during an interval in which the $\overline{mod}_1$ of the programmable frequency divider 10-1 is of a logic "0" level and each of the outputs at all the terminals Q of the programmable frequency dividers subsequent to the programmable frequency divider 10-1 is of a logic "0" level. As a consequence, the NOR gate 20 outputs a logic "0" level, and hence the programmable frequency divider 10-0 divides the frequency of the clock pulse $f_0$ by three only one time on the positive edge thereof, and thereafter delivers the result of its frequency division to the $Q_0$ terminal thereof.

When each of the ($D_0$) signal and the (+1) instruction signal is of a logic "1" level, the $OC_{1'}$ signal is maintained at a logic "1" level during an interval in which the $\overline{mod}_1$ of the programmable frequency divider 10-1 is of the logic "0" level and the outputs at the terminals Q of the programmable frequency dividers after the programmable frequency divider 10-1 are all of the logic "0" level. On the other hand, the $OC_1$ signal is maintained at a logic "1" level when each of the outputs at all the terminals Q of the programmable frequency dividers subsequent to the programmable frequency divider 10-1 is of a logic "0" level. Since the NOR gate 20 outputs a logic "0" level twice in response to these inputs $OC_1$, $OC_{1'}$, the programmable frequency divider 10-0 divides the frequency of the clock pulse $f_0$ by three two times on the positive edge thereof and then outputs the result of its frequency division to the $Q_0$ terminal. Specifically, when the outputs at the terminals Q of the programmable frequency dividers 10-1, 10-2, 10-3, . . . cascade-connected to one another in the form of plural stages are of a "0(H)" and a "1(H)", the programmable frequency divider 10-0 divides the frequency of the clock pulse by three, thereby achieving a division ratio greater than a preset division ratio by (+1), i.e., the division of the division ratio by (+1).

FIGS. 5a through 5d are timing charts for describing the above frequency-division operations.

According to the timing chart shown in FIG. 5a, each of the (+1) instruction signal, the ($D_0$) signal, the ($D_1$) signal, and a ($D_3$) signal is of a logic "0" level and the ($D_2$) signal is of a logic "1" level, and an output $MOD_3$ is of a logic "0" level. Thus, the division of the frequency of the clock pulse by twenty ($=2^4+D_3D_2D_1D_0(B)+(+1)$ instruction signal level (B) $=16+0100(B)+0(B)=20$) is performed. The symbol (B) is an abbreviation of "binary" (hereinafter be abbreviated "(B)"). FIG. 5b shows one of the timing charts shown in FIG. 5, in which the ($D_0$) signal in FIG. 5a is changed from the logic "0" level to the logic "1" level. In this case, the programmable frequency divider 10-0 divides the frequency of the clock pulse by three one time during an interval in which each of the outputs at the terminals $Q_1$ through $Q_3$ is of a "0(H)", thereby carrying out the frequency-division of the clock pulse by twenty one ($=2^4+0100(B)+0(B)=21$). FIG. 5c shows the other of the timing charts, in which the (+1) instruction signal in FIG. 5a is changed from the logic "0" level to the logic "1" level. In this case, the programmable frequency divider 10-0 divides the frequency of the clock pulse by three one time when each of the outputs at the terminals $Q_1$ through $Q_3$ is of a "1(H)", thereby enabling the division of the frequency of the clock pulse by twenty one ($=2^4+0100(B)+1(B)=21$). FIG. 5d illustrates the remaining timing chart in which the ($D_0$) signal in FIG. 5c is changed from the logic "0" level to the logic "1" level. In this case, the programmable frequency divider 10-0 divides the frequency of the clock pulse by three two times when the outputs at the terminals Q of the programmable frequency dividers 10-0, 10-1, 10-2, 10-3 are of a "1(H)" and a "0(H)", thereby enabling the division of the frequency of the clock pulse by twenty two ($=2^4+0101(B)+1(B)=22$). As a consequence, the division of the division ratio by +1 is made.

When the (+1) instruction signal in FIG. 5a is changed from the logic "0" level to the logic "1" level in FIG. 5c, a division ratio of "20" is changed to a division ratio of "21", i.e., the division ratio is incremented by "+1". On the other hand, when the (+1) instruction signal in FIG. 5b is changed from the logic "0" level to the logic "1" level in FIG. 5d, a division ratio of "21" is set to a division ratio of "22", i.e., the division ratio is increased by "+1". Thus, the division ratio is incremented by (+1) according to the level of the (+1) instruction signal.

Accordingly, the division of the frequency of the clock pulse by three according to the level of the ($D_0$) signal is carried out during an interval in which each of the outputs at the terminals $Q_1$, $Q_2$, $Q_3$ is "000", whereas the division of the frequency of the clock pulse by three according to the level of the (+1) instruction signal is performed during an interval in which each of the outputs at the terminals $Q_1$, $Q_2$, $Q_3$ is "100".

A description will now be made of a second embodiment of the present invention.

Figure 6:
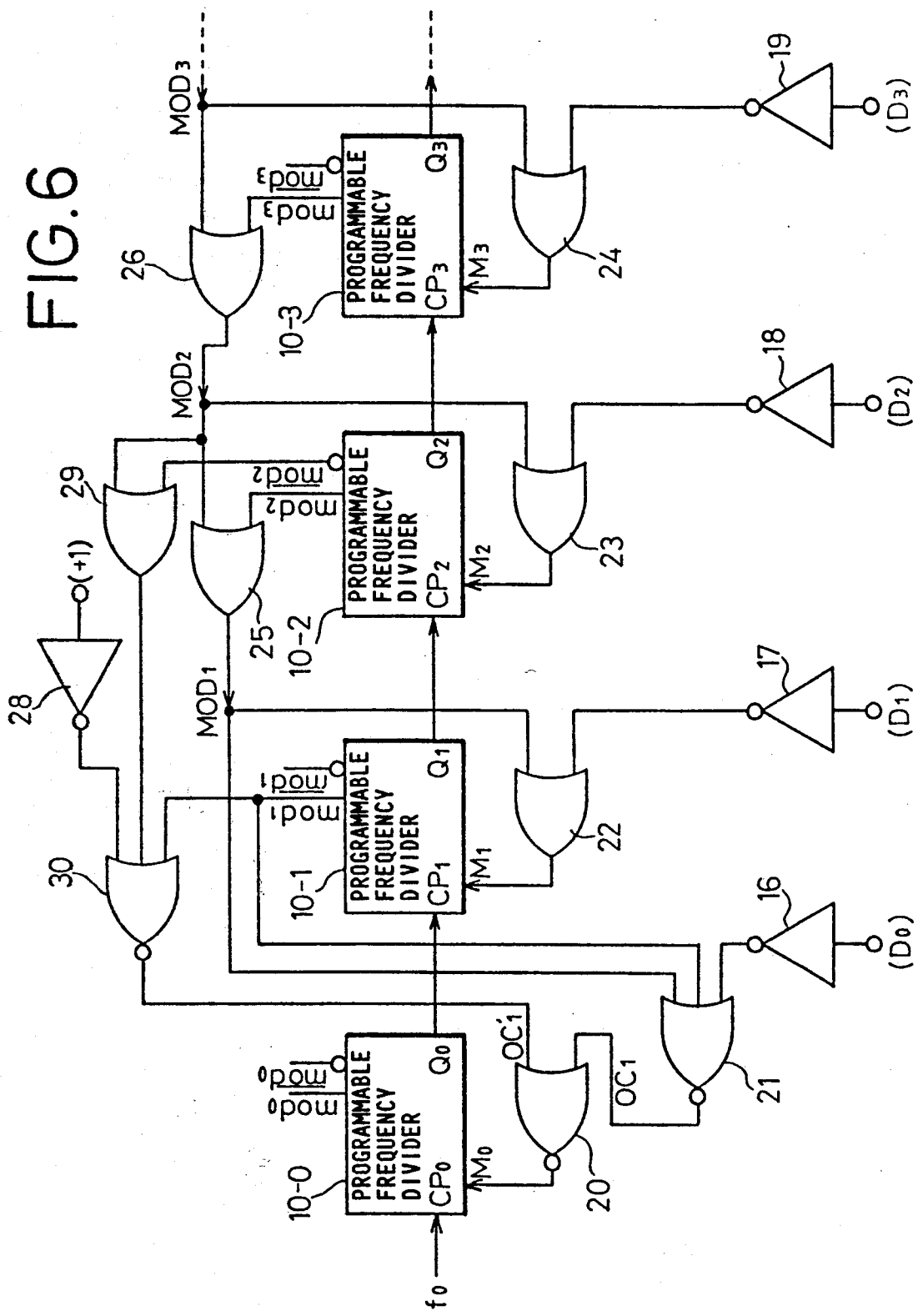
FIG. 6 is a block diagram showing a structure of a programmable frequency dividing apparatus according to a second embodiment of the present invention.

FIG. 6 is a block diagram showing a structure of the second embodiment of the present invention.

In the illustrated embodiment, as an alternative to the NOR gate 27 employed in the first embodiment, there are disposed an OR gate 29 supplied with an output $\overline{mod}_2$ of a programmable frequency divider 10-2 and an output $MOD_2$ of an OR gate 26, and a NOR gate 30 inputted with the output of the OR gate 29, a signal obtained by inverting a (+1) instruction signal with an inverter 28 and an output $mod_1$ of a programmable frequency divider 10-1. The output of the NOR gate 30 is supplied to a NOR gate 20 as one of both inputs thereof, i.e., an input $OC'_1$.

In the second embodiment, the OR gates 26, 29, and the NOR gate 30 exclusive of the output from the inverter 28 constitute a gate circuit for determining or detecting whether or not each of outputs at respective terminals Q of the programmable frequency dividers . . . 10-3, 10-2, 10-1 is of a predetermined pattern. In the illustrated embodiment, the gate circuit constructed as described above is used to detect that each of the outputs at the terminals Q of the programmable frequency dividers . . . , 10-3, 10-2, 10-1 is of a 2(H).

Then, the OR gates 26, 29, the inverter 28, the NOR gate 30 inclusive of the output from the inverter 28, and the NOR gate 20 constitute a gate circuit for detecting that each of the outputs at the respective terminals Q of the programmable frequency dividers . . . , 10-3, 10-2, 10-1 is of a 2(H) so as to cause the programmable frequency divider 10-0 to divide the frequency of a clock pulse $f_0$ by three.

Incidentally, the OR gates 25, 26, the inverter 16, and the NOR gates 20, 21 in the present embodiment are identical to those employed in the first embodiment.

These components will further be apparent from the following description of the operation of the second embodiment which will be described later.

In the second embodiment constructed as described above, when a ($D_0$) signal and a (+1) instruction signal are both of a logic "0" level, each of an $OC_1$ signal and an $OC'_1$ signal is maintained at a logic "0" level, and the NOR gate 20 outputs a logic "1" level. Therefore, the programmable frequency divider 10-0 divides the frequency of the input clock pulse $f_0$ by two on the positive edge thereof and then delivers the result of its frequency division to a terminal $Q_0$ thereof. When the ($D_0$) signal is of a logic "1" level and the (+1) instruction signal is of a logic "0" level, the $OC'_1$ signal is maintain at a logic "0" level, and the $OC_1$ signal is maintained at a logic "1" level during an interval in which each of the outputs at all the terminals Q of the programmable frequency dividers after the programmable frequency divider 10-1 is of a logic "0" level. As a consequence, the NOR gate 20 outputs a logic "0" level, and hence the programmable frequency divider 10-0 divides the frequency of the clock pulse $f_0$ by three only one time and then delivers the result of its frequency division to the terminal $Q_0$.

When the ($D_0$) signal is of a logic "0" level and the (+1) instruction signal is of a logic "1" level, the $OC_1$ signal is maintained at a logic "0" level, and the $OC'_1$ signal is maintained at a logic "1" level when the output $\overline{mod}_2$ of the programmable frequency divider 10-2 is of a logic "0" level, and the output at the terminal Q of the programmable frequency divider 10-1 and the outputs at all the terminals Q of the programmable frequency dividers subsequent to the programmable frequency divider 10-3 are of a logic "0" level. Thus, the NOR gate 20 outputs a logic "0" level, and hence the programmable frequency divider 10-0 divides the frequency of the clock pulse $f_0$ by three only one time and then sends the result of its frequency division to the terminal $Q_0$.

When the ($D_0$) signal and the (+1) instruction signal are both of a logic "1" level, the $\overline{OC'}_1$ is brought to a logic "1" level when the output $\overline{mod}_2$ of the programmable frequency divider 10-2 is of a logic "0" level, and the output at the terminal Q of the programmable frequency divider 10-1 and the outputs at all the terminals Q of the programmable frequency dividers after the programmable frequency divider 10-3 are of a logic "0" level. In addition, the $OC_1$ signal is brought to a logic "1" level when the outputs at all the terminals Q of the programmable frequency dividers subsequent to the programmable frequency divider 10-1 are of a logic "0" level. Since the NOR gate 20 outputs a logic "0" level twice in response to these inputs $OC_1$, $OC'_1$, the programmable frequency divider 10-0 divides the frequency of the clock pulse $f_0$ by three two times on the positive edge thereof and then delivers the result of its frequency division to the terminal $Q_0$. Specifically, when the outputs at the terminals Q of the programmable frequency dividers 10-1, 10-2, 10-3, . . . cascade-connected to one another in the form of plural stages are of a "0(H)" and a "2(H)", the programmable frequency divider 10-0 divides the frequency of the clock pulse $f_0$ by three, thereby enabling the division of the division ratio by +1.

In the above-described first and second embodiments, the clock pulse $f_0$ is frequency-divided in the above-described manner on the positive edge thereof. However, it may be frequency-divided on the negative edge thereof. These embodiments have shown and described a case in which the division of the division ratio by (+1) is carried out during an interval in which the outputs at the terminals Q of the programmable frequency dividers after the programmable frequency divider corresponding to the second stage are of a "1(H)" and a "2(H)". However, the frequency division referred to above can be performed in the same manner as described above even when the above-described outputs are of those other than the "1(H)" and the "2(H)". In addition, such frequency division may be carried out using the $\overline{Q}$ outputs of the programmable frequency dividers 10-1, 10-2, 10-3, . . .

A description will now be made of a third embodiment of the present invention.

Figure 7:
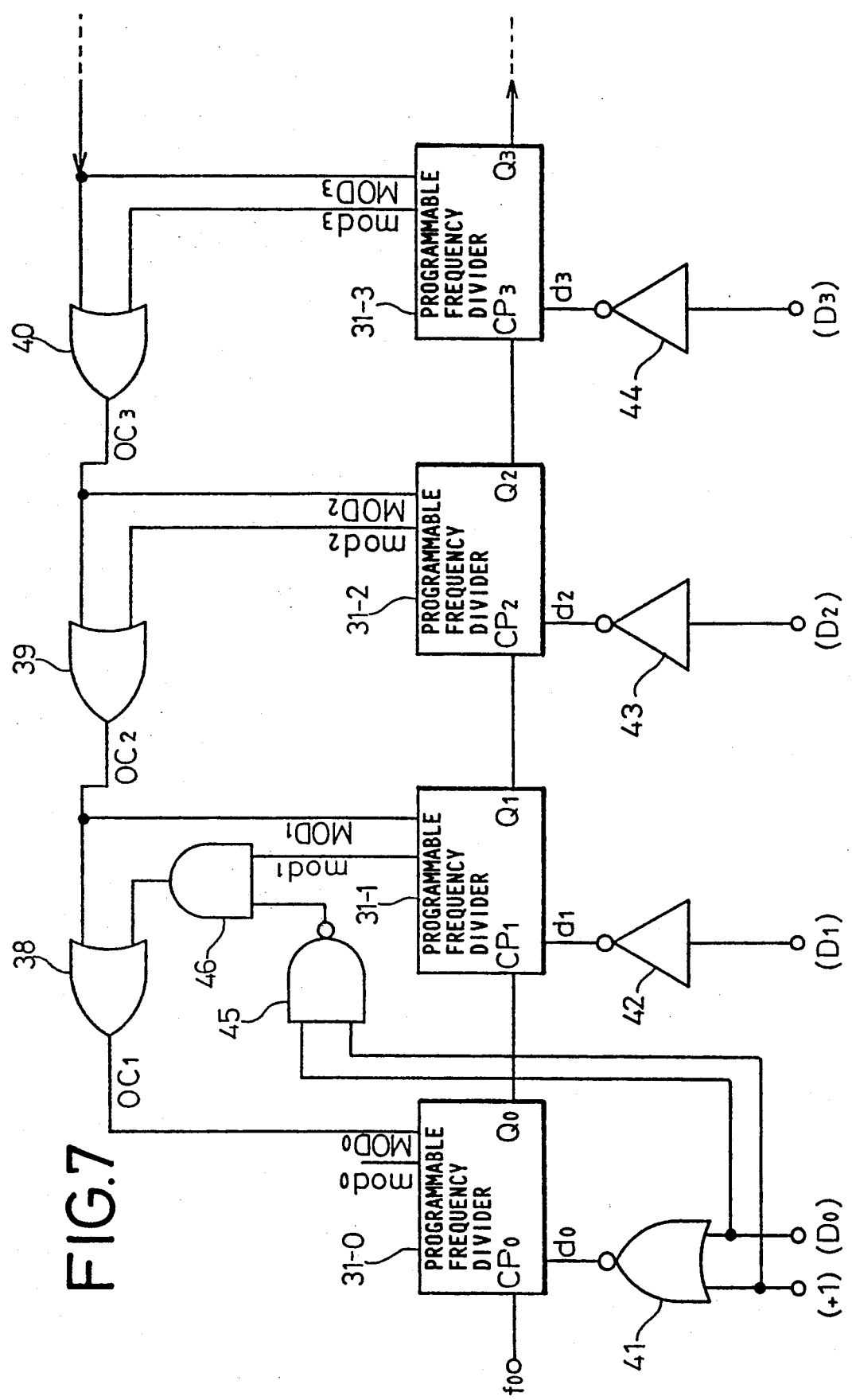
FIG. 7 is a block diagram depicting a structure of a programmable frequency dividing apparatus according to a third embodiment of the present invention.

FIG. 7 is a block diagram showing a structure of the third embodiment. A programmable frequency dividing apparatus according to the third embodiment comprises a plurality of stages of cascade-connected programmable frequency dividers each of which constitutes a 2-scale-factor prescaler shown in FIG. 8. More specifically, the programmable frequency dividing apparatus according to the third embodiment comprises cascade-connected programmable frequency dividers (which correspond to cascade-connected programmable frequency dividing stages and may collectively be considered to be a single programmable frequency dividing network) 31-0, 31-1, 31-2, 31-3, . . . , each of which selectively divides the frequency of a clock signal by two and three.

Figure 8:
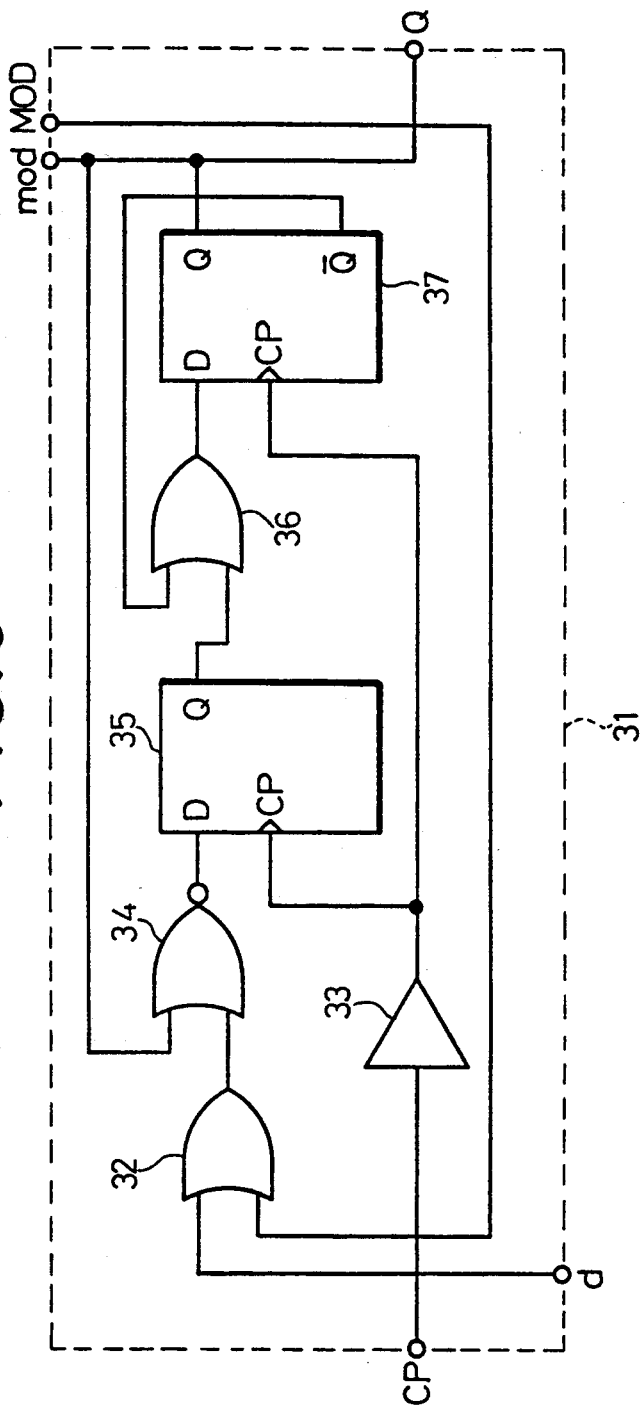
FIG. 8 is a block diagram illustrating a structure of a 2-scale-factor prescaler employed in the programmable frequency dividing apparatus according to the third embodiment of the present invention.

As shown in FIG. 8, each of the programmable frequency dividers 31-0, 31-1, 31-2, 31-3, . . . has an OR gate 32 supplied with a preset input d and an input MOD, a NOR gate 34 inputted with the output of the NOR gate 32 and the Q output of a D flip-flop 37 corresponding to a second stage to be described later, a D flip-flop 35 supplied with the output of the NOR gate 34 to a terminal D thereof, an OR gate 36 inputted with the Q output of the D flip-flop 35 and the $\overline{Q}$ output of the D flip-flop 37, and the D flip-flop 37 supplied with the output of the OR gate 36 to a terminal D thereof. In each of the programmable frequency dividers 31-0, 31-1, 31-2, 31-3, . . . , a clock pulse amplified by a buffer amplifier 33 is applied to each of the D flip-flops 35 and 37 as a clock signal, and thereafter the respective inputs at the terminals D of the D flip-flops 35 and 37 are read on the rising edge of the clock signal and stored therein.

Then, OR gates 38, 39, 40, . . . are connected to the programmable frequency dividers 31-0, 31-1, 31-2, 31-3, . . . respectively in order to set the output OC(i-1) of each OR gate inputted with an OC(i) signal and a mod-(i-1) from the next stage, to a MOD(i-2) of the previous stage. In addition, a (+1) instruction signal and a preset input $D_0$ are inputted to a NOR gate 41, and the output of the NOR gate 41 is applied to the programmable frequency divider 31-0 as a preset input $d_0$. Preset inputs $D_1$, $D_2$, $D_3$, . . . are inverted by inverters 42, 43, 44, . . . , so as to be applied to the programmable frequency dividers 31-1, 31-2, 31-3, . . . as preset inputs $d_1$, $d_2$, $d_3$, respectively. Further, the (+1) instruction signal and the preset input $D_0$ are supplied to a NAND gate 45, and the output of the NAND gate 45 and an output $mod_1$ of the programmable frequency divider 31-1 are supplied to an AND gate 46. Furthermore, the output of the AND gate 46 is inputted to the OR gate 38 together with an $MOD_1$ signal. Incidentally, the clock pulse to be supplied to the programmable frequency divider 31-0 is denoted by $f_0$ in FIG. 7.

In the third embodiment, the OR gates 38, 39, 40, and the AND gate 46 constitute a gate circuit for determining or detecting whether or not the Q output of each of the programmable frequency dividers . . . , 31-3, 31-2, 31-1 is of a predetermined pattern, in cooperation with the NAND gate 45. In the third embodiment, this gate circuit is used to detect that the Q outputs of the programmable frequency dividers . . . , 31-3, 31-2, 31-1 assume a 0(H) and a 1(H). The OR gates 38, 39, 40, the NOR gate 41, the NAND gate 45 and the AND gate 46 form a gate circuit for causing the programmable frequency divider 31-0 to divide the frequency of the clock pulse $f_0$ by three when the gate circuit detects that the Q output of each of the programmable frequency dividers . . . , 31-3, 31-2, 31-1 is of a 0(H) at the time that either the (+1) instruction signal or the preset input $D_0$ is inputted, and for causing the programmable frequency divider 31-0 to divide the frequency of the clock pulse $f_0$ by three when the gate circuit detects that the respective Q outputs of the programmable frequency dividers . . . , 31-3, 31-2, 31-1 assume a 0(H) and a 1(H) at the time that the (+1) instruction signal and the preset input $D_0$ are both inputted.

In the third embodiment constructed as described above, the OR gate 8 (see FIG. 1) corresponds to each of the OR gates 38, 39, 40 and the OR gate 2 is associated with the OR gate 32. In addition, the inverter 1 corresponds to each of the NOR gate 41 and the inverters 42, 43, 44. The programmable frequency dividing apparatus according to the third embodiment comprises the programmable frequency divider shown in FIG. 1 arranged in the form of plural stages in tandem. However, the programmable frequency dividing apparatus according to the illustrated embodiment is provided with the NOR gate 41 as an alternative to the inverter corresponding to the first stage. Further, the NAND gate 45 supplied with the two inputs to be applied to the NOR gate 41 and the AND gate 46 for controlling the passage of the output $mod_1$ of the programmable frequency divider 31-1 as the second stage therethrough with the aid of the output of the NAND gate 45 are added thereto. At this time, the output of the AND gate 46 is used as one of both inputs of the OR gate 38 in place of the output $mod_1$ of the programmable frequency divider 31-1. In the programmable frequency dividing apparatus referred to above, the programmable frequency divider 31-0 is caused to divide the frequency of the clock pulse $f_0$ by three which shall be repeated two times, irrespective of the Q output of the programmable frequency divider 31-1 during an interval in which the Q outputs of the programmable frequency dividers 31-2, 31-3, . . . are all of a logic "0" level and the (+1) instruction signal and the preset input $D_0$ are both of a logic "1" level. On the other hand, when each of the Q outputs of the programmable frequency dividers 31-1, 31-2, 31-3, . . . , is of "000", the programmable frequency divider 31-0 is caused to divide the frequency of the clock pulse $f_0$ by three during an interval in which either one of the (+1) instruction signal and the preset input $D_0$ is of a logic "1" level. In the programmable frequency dividing apparatus as illustrated above, the apparatus divides the clock pulse $f_0$ by two where the (+1) instruction signal and preset input $D_0$ are both of logic "0" level.

In the third embodiment constructed as described above, the programmable frequency diviers 31-0, 30-1, 31-2, 31-3, . . . sequentially frequency-divide the clock pulse $f_0$ In this case, each of the programmable frequency dividers 31-1, 31-2, 31-3, . . . performs the frequency-division operation in the same manner as described in the above expression (4).

A description will now be made of the frequency-division operation of the programmable frequency divider 10-0. When the (+1) instruction signal is of a logic "0" level, the NAND gate 45 outputs an H level. Therefore, the AND gate 46 outputs a $mod_1$ level as it is. When the ($D_0$) signal is of a logic "1" level, the NOR gate 41 outputs a logic "0" level. Under this condition, the programmable frequency divider 31-0 divides the frequency of the clock pulse $f_0$ by three on the positive edge thereof and then delivers the result of its frequency division to a terminal $Q_0$ thereof only when the Q outputs of the programmable frequency dividers 31-1, 31-2, 31-3, . . . are all of a logic "0" level. When the ($D_0$) signal is of a logic "0" level, the NOR gate 41 outputs a logic "1" level and hence the programmable frequency divider 31-0 divides the frequency of the clock pulse $f_0$ by two on the positive edge thereof and thereafter feeds the result of its frequency division to the $Q_0$ terminal thereof. When the (+1) instruction signal is of a logic "1" level and the ($D_0$) signal is of a logic "0" level, the NAND gate 45 outputs a logic "1" level and hence the AND gate 46 outputs a $mod_1$ level as it is. Only when the NOR gate 41 outputs a logic "0" level and the Q outputs of the programmable frequency dividers 31-1, 31-2, 31-3 are all of a logic "0" level, the programmable frequency divider 31-0 divides the frequency of the clock pulse $f_0$ by three and then delivers the result of its frequency division to the terminal $Q_0$.

When the (+1) instruction signal is of a logic "1" level and the ($D_0$) signal is of a logic "1" level, the NOR gate 41 outputs a logic "0" level. Since the NAND gate 45 outputs a logic "0" level, the AND gate 46 outputs a logic "0" level irrespective of the level of the $mod_1$. Thus, irrespective of the output at the terminal Q of the programmable frequency divider 31-1 and the outputs at the terminals Q of other programmable frequency dividers are all of a logic "0" level, the programmable frequency divider 31-0 divides the frequency of the clock pulse $f_0$ by three on the positive edge thereof and then delivers the result of its frequency division to the terminal $Q_0$ thereof. In other words, when the outputs at the terminals Q of the programmable frequency dividers 31-1, 31-2, 31-3 are of a "0(H)" and a "1(H)", the programmable frequency divider 31-0 divides the frequency of the clock pulse $f_0$ by three two times, thereby making it possible to divide the division ratio by +1.

FIGS. 9a through 9c show timing charts for describing the frequency division operation described above.

FIG. 9a shows one of the timing charts, in which each of the (+1) instruction signal, the ($D_0$) signal, the ($D_1$) signal, and the ($D_3$) signal is of a logic "0" level and the ($D_2$) signal is of a logic "1" level, and an output $MOD_3$ is of a logic "0" level. Thus, the division of the frequency of the clock pulse $f_0$ by twenty $(=2^4+D_3D_2D_1D_0(B)+(+1)$ instruction signal level $(B)=16+0100+0=20)$ is performed. FIG. 9b shows the other of the timing charts, in which the ($D_0$) signal in FIG. 9a is changed from the logic "0" level to the logic "1" level, and the (+1) instruction signal in FIG.

9a is changed from the logic "0" level to the logic "1" level. In this case, the programmable frequency divider 31-0 divides the frequency of the clock pulse $f_0$ by three one time during an interval in which each of the outputs at the terminals $Q_1$ through $Q_3$ is of a "0(H)", thereby enabling the division of the frequency of the clock pulse $f_0$ by twenty one $(=2^4+0101(B)+0(B)=2^4+0100(B)+1(B)=21)$. FIG. 9c shows the remaining timing chart in which each of the (+1) instruction signal and the ($D_0$) signal in FIG. 9a is changed from the logic "0" level to the logic "1" level. In this case, the programmable frequency divider 31-0 divides the frequency of the clock pulse $f_0$ by three two time during an interval in which the respective outputs at the terminals $Q_1$ through $Q_3$ are of a "1(H)" and a "0(H)", thereby enabling the division of the frequency of the clock pulse $f_0$ by twenty two $(=2^4+0101(B)+1=22)$. Thus, the division of the variable division ratio by (+1) is made.

When the (+1) instruction signal in FIG. 9a is changed from the logic "0" level to the logic "1" level shown in FIG. 9b, a division ratio of "20" is changed to a division ratio of "21", i.e., the division ratio is incremented by "+1". On the other hand, when the (+1) instruction signal in FIG. 9b is changed from the logic "0" level to the logic "1" level shown in FIG. 9c from the time at which the ($D_0$) signal is in a state of a logic "1" level, the division ratio of "21" is changed to a division ratio of "22", i.e., the division ratio is increased by "+1".

Thus, when the Q outputs of the programmable frequency dividers 31-1, 31-2, 31-3 assume "000" and "100", the programmable frequency divider 31-0 divides the frequency of the clock pulse $f_0$ by three during an interval in which the ($D_0$) signal and the (+1) instruction signal are both of a logic "1" level. On the other hand, when the Q outputs of the programmable frequency dividers 31-1, 31-2, 31-3 are of "000", the programmable frequency divider 31-0 divides the frequency of the clock pulse $f_0$ by three during an interval in which either one of the ($D_0$) signal and the (+1) instruction signal is of a logic "1" level.

A fourth embodiment of the present invention will now be described below.

Figure 10:
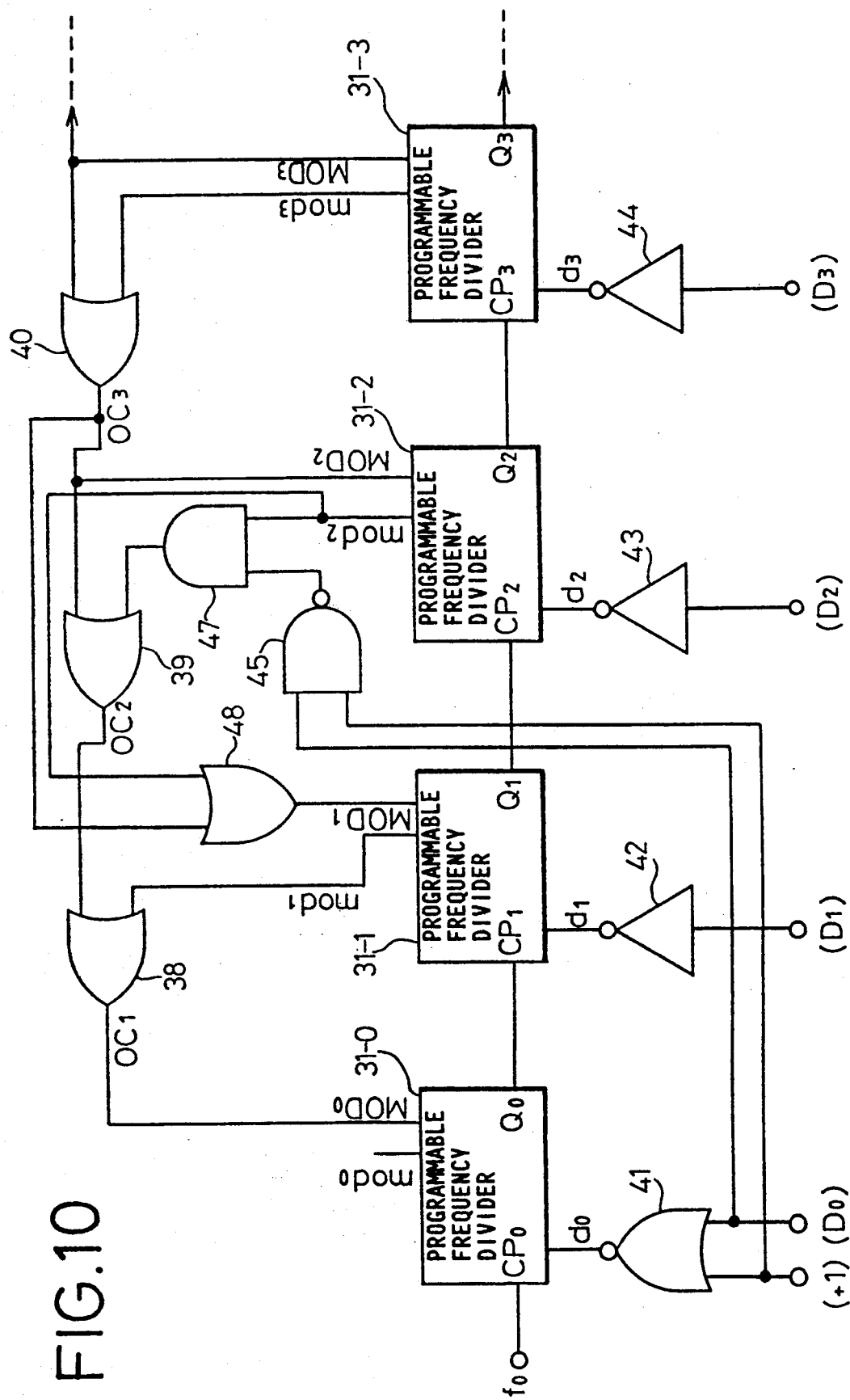
FIG. 10 is a block diagram showing a structure of a programmable frequency dividing apparatus according to a fourth embodiment of the present invention.

FIG. 10 is a block diagram showing a structure of the fourth embodiment of the present invention.

In the fourth embodiment, an AND gate 47 supplied with the output of an NAND gate 45 and an output $mod_2$ of a programmable frequency divider 31-2 is provided as an alternative to the AND gate 46 employed in the third embodiment. The output of the AND gate 47 is supplied to an OR gate 39 as one of both inputs thereof, and an output $mod_1$ of a programmable frequency divider 31-1 is directly supplied to an OR gate 38 as one of both inputs thereof. Further, an OR gate 48 supplied with the output of a NOR gate 40 and the output $mod_2$ of the programmable frequency divider 31-2 is also provided in the fourth embodiment, and the output of the OR gate 48 is inputted to the programmable frequency divider 31-1 as a $MOD_1$.

In the fourth embodiment, the OR gates 38, 39, 40, 48 and the AND gate 47 constitute a gate circuit for determining or detecting whether or not the Q output of each of the programmable frequency dividers ..., 31-3, 31-2, 31-1 is of a predetermined pattern in cooperation with the NAND gate 45. In the fourth embodiment, this gate circuit is used to detect that the Q outputs of the programmable frequency dividers ..., 31-3, 31-2, 31-1 assume a 0(H) and a 2(H).

The OR gates 38, 39, 40, 48, the NOR gate 41, the NAND gate 45 and the AND gate 47 provides a gate circuit for causing a programmable frequency divider 31-0 to divide the frequency of a clock pulse $f_0$ by three when the gate circuit detects that the Q outputs of the programmable frequency dividers ..., 31-3, 31-2, 31-1 are of a 0(H) and a 2(H) unlike the third embodiment at the time that a (+1) instruction signal and a preset input $D_0$ are inputted.

In the fourth embodiment, as is apparent from the above description, the $mod_2$ of the programmable frequency divider 31-2 is prevented from being outputted out of the AND gate 47 during an interval in which the ($D_O$) signal and the (+1) instruction signal are both of a logic "1" level. Thus, the output of the AND gate 47 is brought to a logic "0" level even if the output $mod_2$ assumes a logic "0" level and a logic "1" level. Therefore, the fourth embodiment is operated in the following manner as an alternative to the third embodiment in which the respective outputs at the terminals Q of the programmable frequency dividers ..., 31-3, 31-2, 31-1 are of a "0(H)" and a "1(H)". That is to say, when the respective outputs at the terminals Q of the programmable frequency dividers ..., 31-3, 31-2, 31-1 are of a "0(H)" and a "2(H)", the programmable frequency divider 31-0 divides the frequency of the clock pulse $f_0$ by three two times during an interval in which the (+1) instruction signal and the ($d_0$) signal are both of a logic "1" level, thereby enabling the division of the division ratio by (+1).

In the third and fourth embodiments constructed as described above, the programmable frequency divider divides the frequency of the clock pulse $f_0$ by two and three on the positive edge thereof. However, it may divide the frequency of the clock pulse $f_0$ by two and three on the negative edge thereof. Further, these embodiments have shown and described a case in which the division of the division ratio by (+1) is carried out during an interval in which the respective outputs at the terminals Q of the programmable frequency dividers after the programmable frequency divider corresponding to the second stage are of a "1(H)" and a "2(H)". However, the division process referred to above can be performed in the same manner as described above even when the above-described outputs are of those other than the "1(H)" and the "2(H)". In addition, such a division process may be carried out by using the $\overline{Q}$ outputs of the programmable frequency dividers 31-0, 31-1, 31-2, ...

According to the programmable frequency dividing apparatus of the present invention, as has ben described above, when each of the outputs of the programmable frequency dividers after the programmable frequency divider corresponding to the second stage, out of a plurality of programmable frequency dividers constituting the programmable frequency dividing apparatus, is brought to a predetermined pattern, and the instruction signal for dividing the variable division ratio by (+1) is inputted, the programmable frequency divider corresponding to the first stage divides the frequency of the clock pulse by three, thereby making it possible to divide the division ratio of the programmable frequency dividing apparatus by (+1). In addition, any circuit arrangement for carrying out such a process can be achieved by a gating means, and hence this arrangement is relatively simple.

If the present invention is applied to a communication system using a slip phase control phase-locked loop (PLL), of a type wherein frequencies of signals to be used between transmission and reception are different from each other and a variable division ratio is set as needed at the time of a transmit-receive switching operation, then the time required to preset the changeover of the division ratio from one to another can be reduced, and hence high-speed frequency lock can be achieved.

Although certain preferred embodiments have been shown and described, it should be understood that many changes and modifications may be made therein without departing from the scope of the appended claims.

What is claimed is:

1. A programmable frequency dividing apparatus comprising:
   a programmable frequency dividing network comprising a plurality of cascade-connected programmable frequency dividing stages each of which divides a frequency of an input clock pulse by two or three based on a logic level of a preset input signal supplied thereto for changing a division ratio; and
   means for incrementing a division ratio of said programmable frequency dividing network by +1, said incrementing means comprising gating means for detecting whether or not each of outputs of programmable frequency dividing stages of said programmable frequency dividing network subsequent to a second stage of said programmable frequency dividing network assumes a predetermined pattern, and for setting a preset input signal applied to a first stage of said programmable frequency dividing network to a changeover level for causing the first stage of said programmable frequency dividing network to divide the frequency of the clock pulse by three when an instruction signal for incrementing a division ratio by +1 is inputted to said gating means.

2. A programmable frequency dividing apparatus according to claim 1, wherein each of said programmable frequency dividing stages comprises first and second D flip-flops supplied with said clock pulse as an input, a NOR gate inputted with said preset input signal and an Q output of said second D flip-flop, an output of said NOR gate being supplied to said first D flip-flop, and an OR gate inputted with a Q output of said first D flip-flop and a $\overline{Q}$ output of said second D flip-flop, an output of said OR gate being supplied to said second D flip-flop.

3. A programmable frequency dividing apparatus according to claim 1, wherein said gating means comprises at least one OR gate for detecting that outputs of respective programmable frequency dividing stages subsequent to a third stage of said programmable frequency dividing network are all of a logic "0" level.

4. A programmable frequency dividing apparatus according to claim 3, wherein said gating means further comprises a NOR gate supplied with an inverse of an output of the second stage of said programmable frequency dividing network, and the respective outputs of said at least one OR gate, for detecting that all outputs of the corresponding programmable frequency dividing stages after the third stage of said programmable frequency dividing network are of said logic "0" level.

5. A programmable frequency dividing apparatus according to claim 4, wherein said gating means further comprises an inverter for inverting said instruction signal, said NOR gate being supplied with an output of said inverter.

6. A programmable frequency dividing apparatus according to claim 5, wherein said gating means further comprises a first OR gate for detecting that outputs of respective programmable frequency dividing stages subsequent to a fourth stage of said programmable frequency dividing network are all of a logic "0" level, and a second OR gate supplied with an inverse of an output of the third stage of said programmable frequency dividing network and an output of said first OR gate.

7. A programmable frequency dividing apparatus according to claim 6, wherein said NOR gate is supplied with the output of said inverter, the output of said second OR gate, and the output of said second stage of the programmable frequency dividing network.

8. A programmable frequency dividing apparatus comprising:
   a programmable frequency dividing network comprising a plurality of cascade-connected programmable frequency dividing stages each of which selectively divides a frequency of an input clock pulse by two or three during an interval in which each of first and second signals is of a predetermined logic level;
   a first logic circuit producing an output which is set to a logic level for making a decision as to a division of the frequency of the clock pulse by three when either one of a preset input ($D_0$) and an instruction signal for incrementing a variable division ratio by +1, or both, are inputted, the output thereof inputted as a first signal to a first stage of said programmable frequency dividing network;
   a second logic circuit for interrupting outputs of a predetermined number of programmable frequency dividing stages of said programmable frequency dividing network subsequent to a second stage of said programmable frequency dividing network when both of said preset input ($D_0$) and said instruction signal are inputted; and
   gating means supplied with an output of said second logic circuit and for detecting that each of the outputs of the programmable frequency dividing stages of said programmable frequency dividing network subsequent to the second stage of said programmable frequency dividing network is of a predetermined pattern, an output of said gating means being used as a second signal to be applied to the first stage of said programmable frequency dividing network.

9. A programmable frequency dividing apparatus according to claim 8, wherein each of said programmable frequency dividing stages comprises first and second D flip-flops supplied with said clock pulse as an input, a first OR gate inputted with said first and second signals each serving as a preset input signal, a NOR gate supplied with an output of said first OR gate and a Q output of said second D flip-flop, an output of said NOR gate being supplied to said first D flip-flop, and a second OR gate inputted with a Q output of said first D flip-flop and a $\overline{Q}$ output of said second D flip-flop, an output of said second OR gate being supplied to said second D flip-flop.

10. A programmable frequency dividing apparatus according to clam 8, wherein said gating means includes a plurality of OR gates for detecting that all outputs of respective programmable frequency dividing stages after a third stage of said programmable frequency dividing network are of a logic "0" level.

11. A programmable frequency dividing apparatus according to claim 8, wherein said gating means includes means for detecting that said predetermined pattern of each of the outputs of the programmable frequency dividing stages subsequent to the second stage of said programmable frequency dividing network is 1 hexadecimal.

12. A programmable frequency dividing apparatus according to claim 8, wherein said gating means includes means for detecting tat said predetermined pattern of each of the outputs of the programmable frequency dividing stages subsequent to the second stage of said programmable frequency dividing network is 2 hexadecimal.

13. A programmable frequency dividing apparatus according to claim 8, wherein said first logic circuit comprises a NOR gate.

14. A programmable frequency dividing apparatus according to claim 8, wherein said second logic circuit comprises a NAND gate.

15. A programmable frequency dividing apparatus comprising:
   a programmable frequency dividing network comprising a plurality of cascade-connected programmable frequency dividing stages each of which divides a frequency of an input clock pulse by two or three based on a logic level of a preset input signal supplied thereto for changing a division ratio; and
   gating means for detecting whether or not each or outputs of programmable frequency dividing stages of said programmable frequency dividing network subsequent to a second stage of said programmable frequency dividing network assumes a predetermined pattern, and for setting a preset input signal applied to a first stage of said programmable frequency dividing network to a changeover level for causing the first stage of said programmable frequency dividing network to divide the frequency of the clock pulse by three when an instruction signal for incrementing a division rate by +1 is inputted;
   said gating means comprising;
      at least one OR gate for detecting that outputs of respective programmable frequency dividing stages subsequent to a third stage of said programmable frequency dividing network are all of a logic "0" level;
      an inverter for inverting said instruction signal; and
      a NOR gate supplied with an output of said inverter, an inverse of an output of said second stage of said programmable frequency dividing network, and respective outputs of said at least one OR gate, for detecting that all outputs of the corresponding programmable frequency dividing stages after said third stage of said programmable frequency dividing network are of said logic "0" level.

* * * * *

UNITED STATES PATENT AND TRADEMARK OFFICE
CERTIFICATE OF CORRECTION

PATENT NO. : 5,195,111

DATED : March 16, 1993

INVENTOR(S) : Nobuyuki, ADACHI

Figure 2:
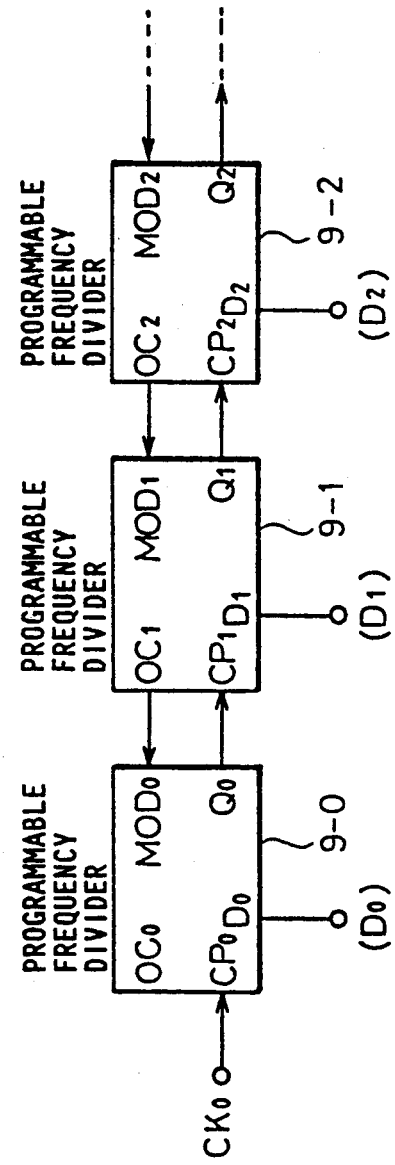
FIG. 2 is a block diagram of a programmable frequency dividing apparatus comprising the 2-scale-factor prescaler shown in FIG. 2 FIG. 1 arranged in tandem in the form of plural stages.

It is certified that error appears in the above-identified patent and that said Letters Patent is hereby corrected as shown below:

Column 3, line 62, delete "FIG. 2".

Column 16, line 33, after "thereof", insert --being--.

Column 17, line 13, "tat" should be --that--.

Signed and Sealed this

Twenty-seventh Day of December, 1994

Attest:

BRUCE LEHMAN

Attesting Officer     Commissioner of Patents and Trademarks